(12) United States Patent
Kawamura

(10) Patent No.: US 8,368,406 B2
(45) Date of Patent: Feb. 5, 2013

(54) INSULATION MEASURING APPARATUS

(75) Inventor: Yoshihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 320 days.

(21) Appl. No.: 12/889,654

(22) Filed: Sep. 24, 2010

(65) Prior Publication Data

US 2011/0084705 A1  Apr. 14, 2011

(30) Foreign Application Priority Data

Oct. 13, 2009  (JP) .................................. 2009-236550
Dec. 24, 2009  (JP) .................................. 2009-292636

(51) Int. Cl.
*G01R 31/02* (2006.01)
(52) U.S. Cl. .......................... 324/551; 324/557; 324/503
(58) Field of Classification Search ................... 324/551, 324/557, 503, 658, 691, 713
See application file for complete search history.

(56) References Cited

U.S. PATENT DOCUMENTS

| | | | | |
|---|---|---|---|---|
| 2005/0073317 | A1* | 4/2005 | Yamamoto et al. | ........... 324/503 |
| 2007/0210805 | A1 | 9/2007 | Kawamura | |

FOREIGN PATENT DOCUMENTS

| | | | |
|---|---|---|---|
| GB | 1589957 | A | 5/1981 |
| JP | 2004170103 | A | 6/2004 |

OTHER PUBLICATIONS

Search Report and Written Opinion dated Jul. 17, 2012 issued by the French Intellectual Property Office in counterpart French Application No. FR1058330.

* cited by examiner

*Primary Examiner* — Vincent Q Nguyen
(74) *Attorney, Agent, or Firm* — Sughrue Mion, PLLC

(57) ABSTRACT

An insulation measuring apparatus having a measuring circuit including a first capacitor; a control unit that reads a voltage set on the first capacitor to decide an insulation state of a power supply, and control a path configuration of the measuring circuit; a switching section provided in a path located between the measuring circuit and the control unit; and a second capacitor provided between a ground and a path located between the switching section and the control unit. The control unit controls the path configuration of the measuring circuit, by turning ON the switching section to set a voltage corresponding to the voltage that is set on the first capacitor on the second capacitor, and then by turning OFF the switching section to read the voltage set on the second capacitor and to discharge an electric charge corresponding to the voltage being set on the first capacitor.

13 Claims, 10 Drawing Sheets

INSULATION MEASURING APPARATUS

BACKGROUND OF THE INVENTION

1. Technical Field

The present invention relates to an insulation measuring apparatus and, more particularly, an insulation measuring apparatus capable of measuring an insulation resistance by using a flying capacitor, for example.

2. Background Art

In order to supply an electric power to electrical equipments such as a light illuminating system, an air conditioner, etc. or to give a charge of electricity to the equipments, conventionally an automobile is equipped with a battery. The recent automobiles so utterly depend on the electric power that it would be no exaggeration to say that the automobile cannot work without the electric power.

Also, restrictions on an exhaust gas (emission control) are getting tighter from a viewpoint of the global warming measure, and the like. In answer to this tendency, a part of automobile manufacturers already puts hybrid vehicles, which employ both an engine and a battery as a driving power, onto the market to reduce consumption of fuel. Also, this tendency is accelerating more and more, and now the battery is being used as the driving power in a huge number of automobiles.

Under such circumstances, electric power management becomes more important for the automobile manufacturer than ever before. In particular, the voltage that is very higher than the conventional voltage is employed in the situation that a high-power battery is equipped for the driving purpose. Therefore, it is highly possible that an electric shock is caused when the insulation is degraded. For this reason, monitoring of an insulation state becomes more important nowadays than heretofore.

As the technology to check an insulation state, various technologies have been introduced. For example, there is an insulation measuring circuit of flying capacitor type (see JP2004-170103A). FIG. 1 shows a circuit diagram of an insulation measuring circuit 110 disclosed in JP2004-170103A. Also, FIG. 2 is a time chart explaining the data reading by AD of a decision control unit 130 (referred to as an "AD reading" hereinafter).

The insulation measuring circuit 110 includes a detecting circuit 120 and the decision control unit 130, and detects an insulation state of a power supply V. The detecting circuit 120 has a capacitor (flying capacitor) C11 that is set in a floating state from a ground electric potential, and also has first to sixth resistors R11 to R16 and first to fifth switches SW11 to SW15. Each of the first to fifth switches SW11 to SW15 is composed of an optical MOSFET (Metal-Oxide-Semiconductor Field-Effect-Transistor), for example. It is desired that the first resistor R11 and the second resistor R12 should have a very high resistance value such that an insulation of the system is not decreased even in the case of short-circuit failure of the switch.

Then, the decision control unit 130 turns ON the first and second switches SW11, SW12 such that a path consisting of the first switch SW11, a first diode D11, the first resistor R11, the capacitor C11, and the second switch SW12 is formed from the positive electrode side of the power supply V to the negative electrode side and that a voltage of the power supply V is set to the capacitor C11 (this voltage is referred to as a "high voltage V10" hereinafter). Then, when the first and second switches SW11, SW12 are turned OFF and the third and fourth switches SW13, SW14 are turned ON (T11 in FIG. 2), a closed circuit consisting of the capacitor C11, a second diode D12, the second resistor R12, the third switch SW13, the third resistor R13, the fourth resistor R14, and the fourth switch SW14 is constructed. A voltage divided by the second resistor R12, the third resistor R13, and the fourth resistor R14 is input into the decision control unit 130 (input port AD) through the sixth resistor R16 and measured as $$V10 \times R13/(R12+R13+R14).$$

In this case, a cathode of a third diode D13 is connected in the middle of the path between the sixth resistor R16 and the input port AD and an anode of the third diode D13 is connected to a ground electric potential. When the measurement is finished, the third switch SW13 is turned OFF and also the fifth switch SW15 acting as the discharge switch is turned ON (T12 in FIG. 2). Thus, an electric charge on the capacitor C11 is discharged through the fifth resistor R15 and the fourth resistor R14 of the fourth switch SW14 (T12 to T13 in FIG. 2). When a discharge is finished (T13 in FIG. 2), the fourth switch SW14 is turned OFF.

Then, the decision control unit 130 charges the capacitor C11 in a state that one terminal of the capacitor C11 is grounded via the fourth resistor R14, and then measures the voltage that is set on the capacitor C11. Concretely, the decision control unit 130 turns ON the first switch SW11 and the fourth switch SW14. According to the ON state of these switches, a path that consists of a negative-electrode side ground fault resistor RLn, the power supply V, the first switch SW11, the first diode D11, the first resistor R11, the capacitor C11, the fourth switch SW14, and the ground potential G is constructed from a ground potential G. At this time, a charging voltage VC11 (negative-electrode side ground fault resistor voltage) is set on the capacitor C11. Then, when the first switch SW11 is turned OFF and the third switch SW13 is turned ON, a divided voltage of the charging voltage VC11 being set on the capacitor C11 similarly to the above is input into the decision control unit 130 through the sixth resistor R16 and measured as $$VC11 \times R13/(R12+R13+R14).$$

When the measurement is finished, the third switch SW13 is turned OFF and the fifth switch SW15 is turned ON. Thus, an electric charge on the capacitor C11 is discharged through the fifth resistor R15 and the fourth resistor R14.

Then, the decision control unit 130 turns ON the second switch SW12 and the third switch SW13. According to the ON state of these switches, a path that consists of the third resistor R13, the third switch SW13, the first diode D11, the first resistor R11, the capacitor C11, the second switch SW12, the power supply V, a positive-electrode side ground fault resistor RLp, and the ground potential G is constructed from the ground potential G. At this time, a charging voltage VC12 (positive-side ground fault resistor voltage) is set on the capacitor C11. Then, when the second switch SW12 is turned OFF and the fourth switch SW14 is turned ON, a divided voltage of the charging voltage VC12 being set on the capacitor C11 similarly to the above is input into the decision control unit 130 through the sixth resistor R16 and measured as $$VC12 \times R13/(R12+R13+R14).$$

When the measurement is finished, the third switch SW13 is turned OFF and the fifth switch SW15 is turned ON. Thus, an electric charge on the capacitor C11 is discharged through the fifth resistor R15 and the fourth resistor R14.

In turn, the decision control unit 130 converts the measured voltage into the insulation resistance based on a computational expression (VC11+VC12)/V10, and then detects how a ground fault resistor RL is detected, by referring to a predetermined table. When the detected ground fault resistor RL is less than a predetermined threshold RLy, the decision control unit 130 decides that the insulation is degraded, and gives a predetermined alarm.

The ON states of the third switch SW13 and the fourth switch SW14 are kept while the decision control unit 130 is reading the AD. In this event, a detecting accuracy is lowered when the electric charge of the capacitor C11 is discharged. Therefore, time constants of the second to fourth resistors R12 to R14 (a resultant time constant of R12+R13+R14) must be set to a value that is large enough to prevent the discharge during the AD reading. Meanwhile, the electric charge of the capacitor C11 must be discharged after the measurement is finished. For this purpose, the fifth resistor R15 and the fifth switch SW15 are provided to constitute a discharging circuit, so that the electric charge on the capacitor C11 remained after the finishing of measurement is discharged quickly by turning ON simultaneously the fourth switch SW14 and the fifth switch SW15.

Here, the discharging circuit consisting of the fifth switch SW15 and the fifth resistor R15 needs the optical MOSFET as the insulation element with a high withstand voltage. Thus, an increase in cost is brought about, and another approach is requested. Also, when the discharging circuit mentioned above is newly provided, an area of the high voltage circuit is extended. Therefore, the more cautious design/configuration are demanded from a viewpoint of safety, and thus there exists such a problem that an increase in cost is also brought about.

SUMMARY OF THE INVENTION

The present invention has been made in view of such circumstances, and it is an object of the present invention to provide the technology to implement an insulation measuring apparatus of flying capacitor type at a low cost so as to shorten a measuring time, while keeping a high detection accuracy.

The present invention provides an insulation measuring apparatus, comprising: a measuring circuit including a first capacitor; a control unit that reads a voltage set on the first capacitor to decide an insulation state of a power supply, and control a path configuration of the measuring circuit; a switching section provided in a path located between the measuring circuit and the control unit; and a second capacitor provided between a ground and a path located between the switching section and the control unit. The control unit controls the path configuration of the measuring circuit, by turning ON the switching section to set a voltage corresponding to the voltage that is set on the first capacitor on the second capacitor, and then by turning OFF the switching section to read the voltage set on the second capacitor and to discharge an electric charge corresponding to the voltage being set on the first capacitor.

According to the present invention, the technology to implement the insulation measuring apparatus of flying capacitor type at a low cost so as to shorten a measuring time while keeping detection accuracy can be provided.

DETAILED DESCRIPTION OF THE EXEMPLARY EMBODIMENTS

Figure 1:
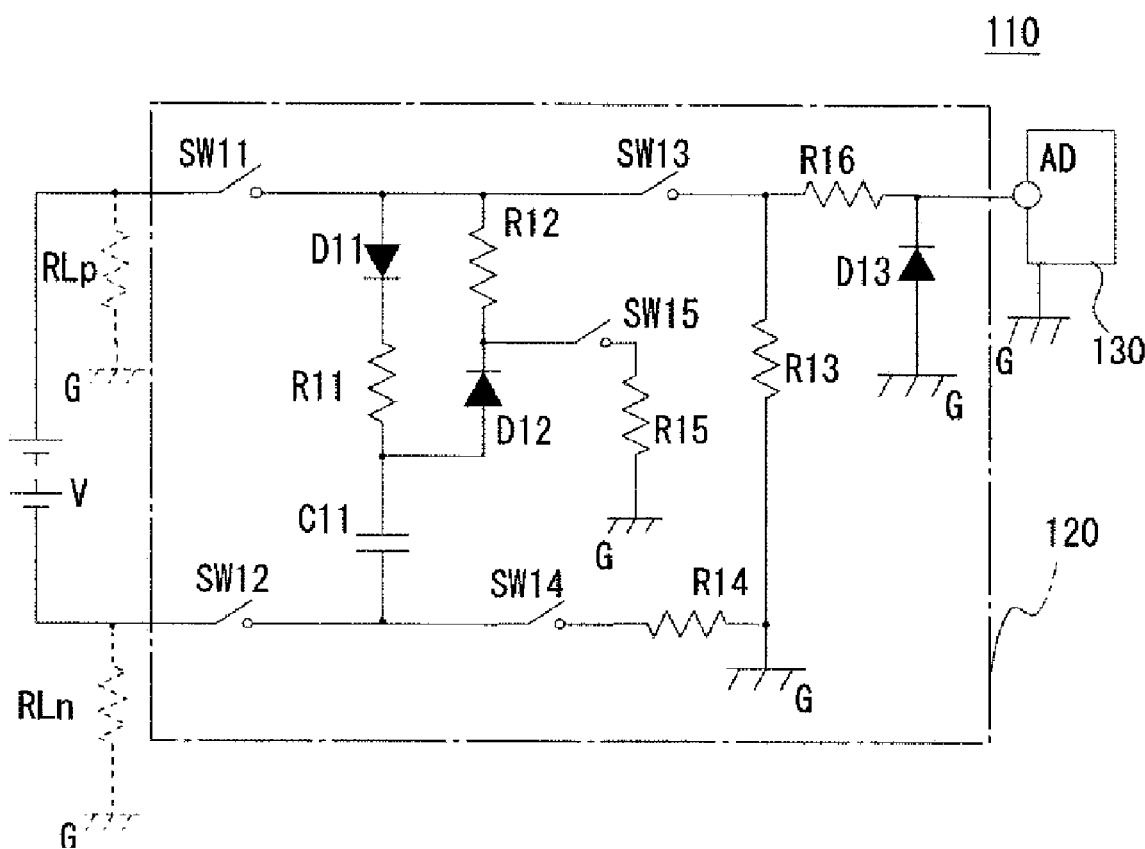
FIG. 1 shows an insulation measuring circuit of flying capacitor type in the background art.
Figure 2:
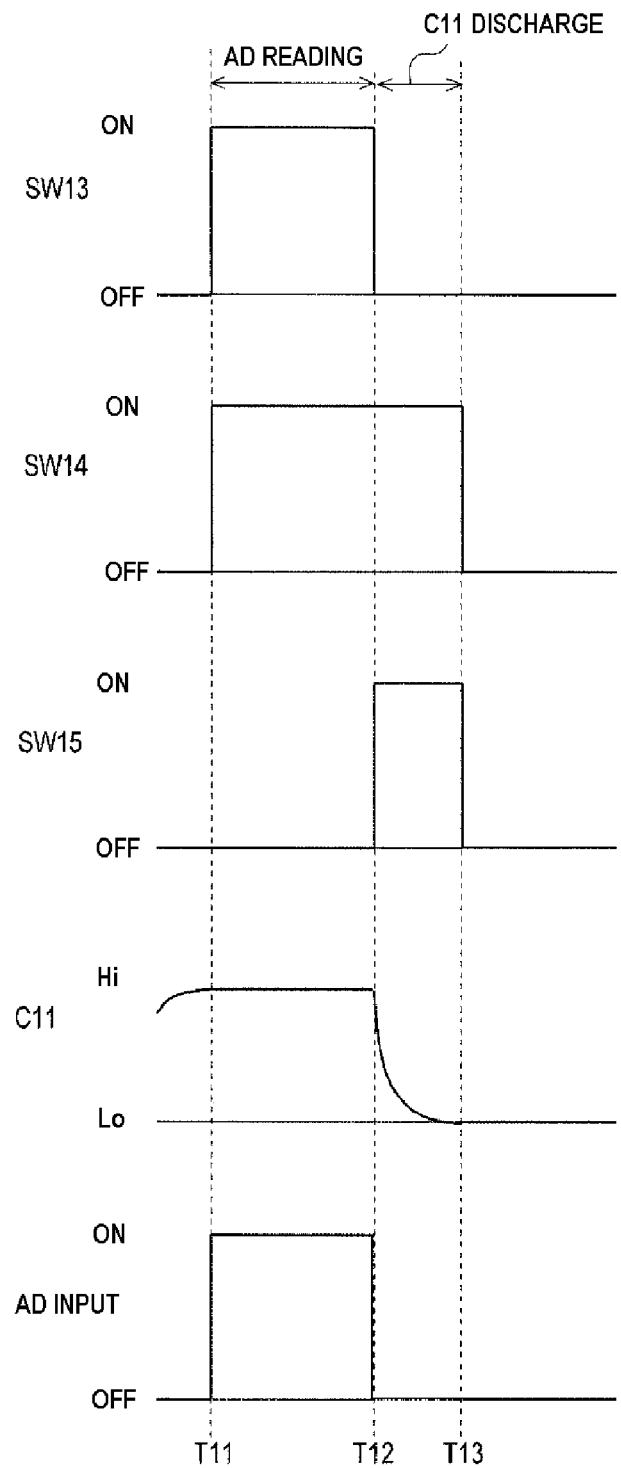
FIG. 2 shows a time chart of an AD reading process in the insulation measuring circuit of flying capacitor type in the background art.

According to an aspect of the present invention, there is provided an insulation measuring apparatus comprising: a measuring circuit including a first capacitor as a flying capacitor; a control unit that is adapted to read a voltage set on the first capacitor to decide an insulation state of a power supply, and control a path configuration of the measuring circuit configured when one selected from a power supply voltage, a positive-electrode side ground fault resistor voltage, and a negative-electrode side ground fault resistor voltage is to be set on the first capacitor; a switching section provided in a path located between the measuring circuit and the control unit, for shutting off the path between the measuring circuit and the control unit; and a second capacitor provided between a ground and a path located between the switching section and the control unit, wherein the control unit is adapted to control the path configuration of the measuring circuit when the control unit is to read the voltage set on the first capacitor, by turning ON the switching section to set a voltage corresponding to the voltage that is set on the first capacitor on the second capacitor, and then by turning OFF the switching section to read the voltage set on the second capacitor and to discharge an electric charge corresponding to the voltage being set on the first capacitor, and in the measuring circuit, a resistance value of a path that is controlled to discharge the electric charge of the first capacitor is being set to a value which the electric charge corresponding to the voltage set on the first capacitor is dischargeable in a reading period of the voltage by the control unit.

The insulation measuring apparatus may be configured in that the control unit turns ON the switching section to discharge the electric charge corresponding to the voltage set on the second capacitor after reading the voltage set on the second capacitor.

According to another aspect of the present invention, there is provided an insulation measuring apparatus, comprising: a measuring circuit including a first capacitor as a flying capacitor; a control unit that is adapted to read a voltage set on the first capacitor to decide an insulation state of a power supply, and control a path configuration of the measuring circuit configured when one selected from a power supply voltage, a positive-electrode side ground fault resistor voltage, and a negative-electrode side ground fault resistor voltage is to be set on the first capacitor; and a second capacitor which is provided between a ground and a path located between the measuring circuit and the control unit, and on which a voltage is set when the voltage is set on the first capacitor, wherein the control unit is adapted to configure a path through which electric charges accumulated on the first capacitor and the second capacitor are discharged when starting an operation of reading the voltage set on the second capacitor, and to compensate a reduction of voltage, which is caused by the discharge in a measuring period of the voltage set on the second capacitor, when measuring the insulation state, and in the measuring circuit, a resistance value of a path that is controlled to discharge the electric charge of the first capacitor is being set to a value which the electric charge corresponding to the voltage set on the first capacitor is quickly discharged in a reading period of the voltage by the control unit.

The insulation measuring apparatus may be configured in that, upon setting the voltage on the first capacitor, the control unit charges the first capacitor for a first predetermined time in which the first capacitor is not fully charged, and then discharges the first capacitor for a second predetermined time, and the control unit calculates the voltage which is to be set when the first capacitor is fully charged by reflecting a charging rate in the first predetermined time and a charging rate in the second predetermined time in a read value of the voltage being set on the first capacitor.

The insulation measuring apparatus may be configured in that the second predetermined time is set as a time elapsed from a start of discharge to a first coincidence point at which a voltage transition occurred from a start of charge on an assumption that a standard product whose specification error is zero is employed as the first capacitor coincides with a voltage transition occurred from a start of charge on an assumption that a plus variation product whose specification error is at a plus maximum is employed as the first capacitor.

The insulation measuring apparatus may be configured in that the second predetermined time is set as a time elapsed from a start of discharge to a second coincidence point at which a voltage transition occurred from a start of charge on an assumption that a standard product whose specification error is zero is employed as the first capacitor coincides with a voltage transition occurred from a start of charge on an assumption that a plus variation product whose specification error is at a minus maximum is employed as the first capacitor.

The insulation measuring apparatus may be configured in that where a point at which a voltage transition occurred from a start of charge on an assumption that a standard product whose specification error is zero is employed as the first capacitor coincides with a voltage transition occurred from a start of charge on an assumption that a plus variation product whose specification error is at a plus maximum is employed as the first capacitor is set as a first coincidence point, and where a point at which a voltage transition occurred from a start of charge on an assumption that a standard product whose specification error is zero is employed as the first capacitor coincides with a voltage transition occurred from a start of charge on an assumption that a minus variation product whose specification error is at a minus maximum is employed as the first capacitor is set as a second coincidence point, the second predetermined time is set from the start of discharge to a point located between the first coincidence point and the second coincidence point.

The insulation measuring apparatus may be configured in that the first capacitor is formed of a ceramics capacitor or a film capacitor.

EMBODIMENTS

Embodiments for carrying out the invention will be explained with reference to the drawings hereinafter. In a first embodiment explained hereunder, the fifth switch SW15 and the fifth resistor R15 acting as the discharging circuit shown in the background art in FIG. 1 are omitted, and a low-voltage analog switch serving as an AD reading switch SWa is added into the input line to the input port AD. Also, an AD reading capacitor Ca that is also used as a filter is provided to constitute a sample and hold circuit. Also, in a second embodiment, as a variation of the first embodiment, a circuit from which diodes of the measuring system (the detection circuit) are omitted is proposed. Further, in a third embodiment, as a variation of the second embodiment, a circuit from which the AD reading switch SWa is omitted and the discharge of the electric charge during the reading of the AD reading capacitor Ca is corrected in the measuring means is proposed.

First Embodiment

Figure 3:
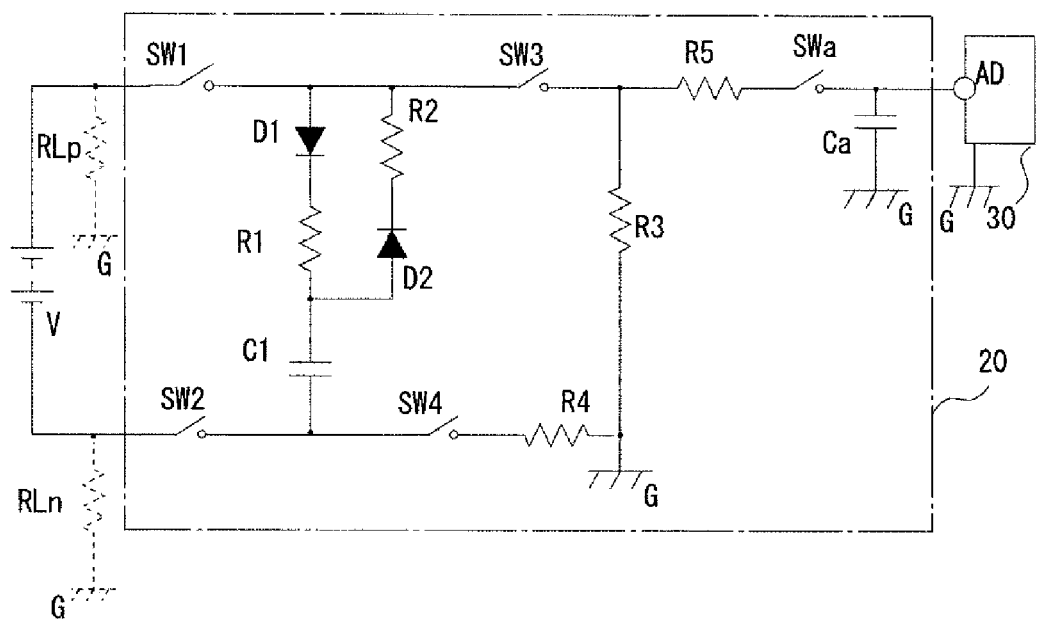
FIG. 3 is a circuit diagram showing a configuration of an insulation measuring circuit of flying capacitor type according to a first embodiment of the present invention.

FIG. 3 is a circuit diagram showing a configuration of an insulation measuring circuit 10 according to a first embodiment of the present invention. As shown in FIG. 3, the insulation measuring circuit 10 includes a detecting circuit 20 and a decision control unit 30, and detects a leakage of electricity by checking an insulation state of the high-voltage power supply V connected to the detecting circuit 20. The insulation states of the positive-electrode side ground fault resistor PLp as an insulation resistance on the positive electrode side of the power supply V and the negative-electrode side ground fault resistor RLn as an insulation resistance on the negative electrode side are detected herein.

The decision control unit 30 has an input port AD, and is equipped with a voltage measuring function of AD-converting a voltage being input into the input port AD and then measuring the voltage, and a function of controlling the opening/closing of the first to fourth switches SW1 to SW4 provided to the detecting circuit 20 described later. Also, the decision control unit 30 converts the voltage being input into the input port AD into an insulation resistance based on a predetermined computational expression. In this case, the decision control unit 30 contains insulation resistance values used for the insulation resistance conversion as a predetermined table, and specifies the insulation resistance by referring to the table.

A first switch SW1, a first diode D1, a first resistor R1, a capacitor C1, and a second switch SW2 are provided in series to the detecting circuit 20 from the positive electrode side of the power supply V to the negative electrode side. Here, in the following explanation, a value of the resistance will be explained by affixing the same notation to the resistance as the reference symbol (for example, a resistance value of the first resistor R1 is assumed as R1).

The detecting circuit 20 has the capacitor C1 as a flying capacitor, first to fourth resistors R1 to R4, first to fourth switches SW1 to SW4, the AD reading switch SWa, and the AD reading capacitor Ca. Each of the first to fourth switches SW1 to SW4 is composed of the optical MOSFET, for example, and has the high withstand voltage/insulation characteristics. The AD reading switch SWa may have a discrete structure using the relatively inexpensive low-voltage analog switch, the FET, or the like.

Concretely, the first switch SW1, the first diode D1, the first resistor R1, the capacitor C1, and the second switch SW2 are connected and arranged in series from the high voltage side of the power supply V to the low voltage side. A rectifying direction of the first diode D1 is directed from the first switch SW1 to the first resistor R1. That is, an anode of the first diode R1 is connected to the first switch SW1, and a cathode of the first diode R1 is connected to a terminal of the capacitor C1 on the high voltage side via the first resistor R1.

Also, in parallel with the path in which the first diode D1 and the first resistor R1 are provided, the second resistor R2 and a second diode D2 are provided from the anode side of the first diode D1. A cathode of the second diode D2 is connected to the second resistor R2, and an anode of the second diode D2 is connected to a terminal of the capacitor C1 on the high voltage side.

Also, the third switch SW3, the third resistor R3, the fourth resistor R4, the fourth switch SW4 are connected in series to a terminal of the capacitor C1 on the low voltage side from the anode of the first diode D1. Also, a path between the third resistor R3 and the fourth resistor R4 is grounded.

Further, a path being connected to the input port AD of the decision control unit 30 is branched from the path located between the third switch SW3 and the third resistor R3. Concretely, a fifth resistor R5 as an AD reading protection resistor and the AD reading switch SWa are provided in series sequentially from a connection point between the third switch SW3 and the third resistor R3 to the input port AD. Then, the AD reading capacitor Ca is provided between the portion of the AD reading switch SWa on the input port AD side and the ground.

Here, the second resistor R2, the third resistor R3, and the fourth resistor R4 are set to a resistance value, which is smaller than that in the background art, respectively such that the electric charge of the capacitor C1 can be discharged completely within a time of a C1 charging voltage measuring cycle, as described later.

Figure 4:
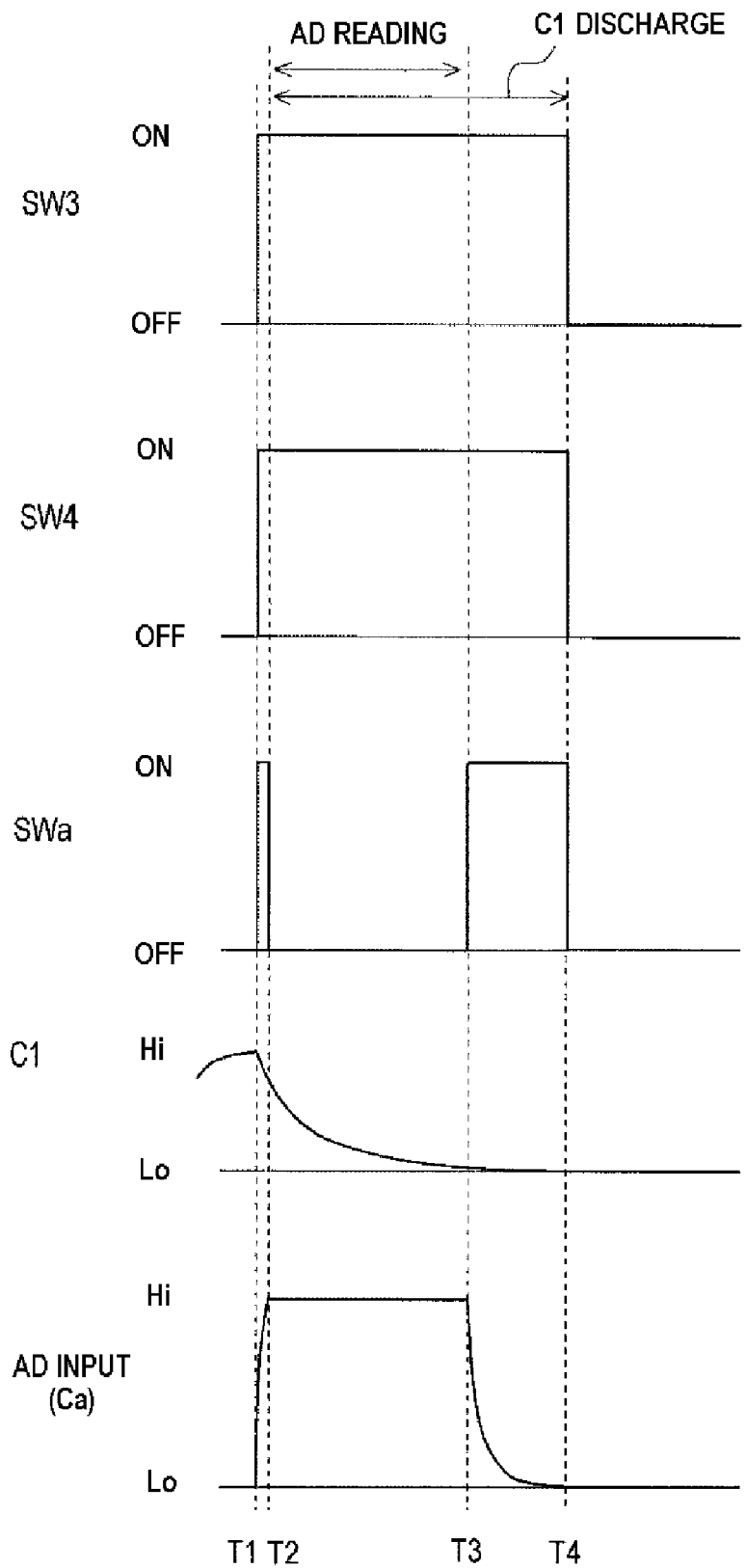
FIG. 4 shows a time chart of an AD reading process in the insulation measuring circuit of flying capacitor type according to the first embodiment.

Next, data reading (AD reading) in the insulation measuring circuit 10 will be explained hereunder. FIG. 4 is a time chart explaining an AD reading process in the decision control unit 30 according to the present embodiment. This time chart shows a process after a voltage (data) is set to the capacitor C1.

1) High Voltage V0 Measuring Mode

First, prior to the AD reading process, the decision control unit 30 turns ON the first and second switches SW1, SW2 to constitute the path, which consists of the first switch SW1, the first diode D1, the first resistor R1, the capacitor C1, and the second switch SW2, from the positive electrode side of the power supply V to the negative electrode side. Thus, the decision control unit 30 sets the voltage from the power supply V on the capacitor C1.

Then, the decision control unit 30 turns OFF the first and second switches SW1, SW2, and turns ON the third and fourth switches SW3, SW4 (T1 in FIG. 4). Then, the decision control unit 30 turns ON the AD reading switch SWa for a very short time (a period T1-T2 in FIG. 4), e.g., about 200 to 300 μs, only. In a period in which the AD reading switch SWa is ON (a period T1-T2 in FIG. 4), a divided voltage of the voltage being set on the capacitor C1 is set on the AD reading capacitor Ca. Concretely, as shown in a time chart of the AD input in FIG. 4, an electric potential of the input port AD rises higher as a larger amount of electric charge is accumulated in the AD reading capacitor Ca. At this time, the electric charge of the capacitor C1 is discharged, but no problem arises substantially in the measurement because such discharge occurs for a very short period only.

Then, when the AD reading switch SWa is turned OFF (T2 in FIG. 4), the electric potential on the AD reading capacitor Ca is held. Then, the decision control unit 30 reads the electric potential that is input into the input port AD in a predetermined period in which the AD reading switch SWa is OFF (T2-T3 in FIG. 4).

At this time, the third switch SW3 and the fourth switch SW4 are still in their ON states and are kept in a state that these switches are electrically isolated from the AD reading capacitor Ca, so that the electric charge on the capacitor C1 is gradually discharged. As described above, the discharge is completed within a desired short time because the second resistor R2, the third resistor R3, and the fourth resistor R4 are set to a sufficiently small resistance value respectively. In this case, no problem arises even though the discharge is extended up to a next period in which the AD reading switch SWa is ON (T3-T4 in FIG. 4).

Then, when the AD reading is finished (T3 in FIG. 4), the decision control unit 30 turns ON the AD reading switch SWa. Here, the third switch SW3 and the fourth switch SW4 are still kept in their ON states. Thus, if the discharge of the electric charge on the capacitor C1 is not completed at that time, not only such discharge is still continued but also the electric charge accumulated on the AD reading capacitor Ca is discharged to the ground via the AD reading switch SWa, the third resistor R3, and the like. In this event, if the electric charge on the AD reading capacitor Ca should be discharged in such a manner that the third switch SW3 and the fourth switch SW4 are turned OFF and the AD reading switch SWa is turned ON after the discharging operation of the electric charge on the capacitor C1 via the third switch SW3 and the fourth switch SW4 both are kept in their ON states is finished, such electric charge on the AD reading capacitor Ca can be discharged more safely. When the discharge is finished (T4 in FIG. 4), the decision control unit 30 turns OFF the third switch SW3, the fourth switch SW4, and the AD reading switch SWa.

2) Positive-Electrode Side Ground Fault Resistor Voltage VC1p Measuring Mode

Then, in a positive-electrode side ground fault resistor voltage VC1p measuring mode, the decision control unit 30 turns ON the second switch SW2 and the third switch SW3, and thus sets the positive-electrode side ground fault resistor voltage VC1p on the capacitor C1. Concretely, according to the ON state of these switches, a path that consists of the third resistor R3, the third switch SW3, the first diode D1, the first resistor R1, the capacitor C1, the second switch SW2, the power supply V, the positive-electrode side ground fault resistor RLp, and the ground potential G is constructed from the ground potential G. The positive-electrode side ground fault resistor voltage VC1p is set on the capacitor C1 by the construction of this path. Then, like the high voltage V0 measuring mode, according to the operations shown in a time chart in FIG. 4, the decision control unit 30 measures an input value of the input port AD, i.e., a value corresponding to the positive-electrode side ground fault resistor voltage VC1p being set on the AD reading capacitor Ca (a divided value of the positive-electrode side ground fault resistor voltage VC1p), and also discharges quickly the electric charges on the capacitor C1 and the AD reading capacitor Ca sequentially.

3) Negative-Electrode Side Ground Fault Resistor Voltage VC1n Measuring Mode

In turn, the decision control unit 30 turns ON the first switch SW1 and the fourth switch SW4, and thus sets the negative-electrode side ground fault resistor voltage VC1n on the capacitor C1. Concretely, according to the ON state of these switches, a path that consists of the negative-electrode side ground fault resistor RLn, the power supply V, the first switch SW1, the first diode D1, the first resistor R1, the capacitor C1, the fourth switch SW4, the fourth resistor R4, and the ground potential G is constructed from the ground potential G. The negative-electrode side ground fault resistor voltage VC1n is set on the capacitor C1 by this path. Then, like the high voltage V0 measuring mode and the positive-electrode side ground fault resistor voltage VC1p measuring mode, according to the operation shown in a time chart in FIG. 4, the decision control unit 30 measures an input value of the input port AD, i.e., a value corresponding to the negative-electrode side ground fault resistor voltage VC1n being set on the AD reading capacitor Ca (a divided value of the negative-electrode side ground fault resistor voltage VC1n), and also discharges quickly the electric charges on the capacitor C1 and the AD reading capacitor Ca sequentially.

4) Insulation Resistor Converting Mode

Then, the decision control unit 30 converts the measured voltage into the insulation resistance based on the above measured result by following Equation, and gives the alarm at need.

Insulation resistance conversion=$(VC1p+VC1n)/V0$

With the above, according to the present embodiment, there is no necessity to provide separately the discharging circuit shown in the background art (the fifth switch SW15 and the fifth resistor R15 in FIG. 1), and also the discharge can be completed in a short time. Also, the AD reading switch SWa may be formed of the low-voltage analog switch or the discrete configuration, and both a size reduction/a space saving and a reduction in cost can be implemented because the high withstand voltage and high insulation performances are not needed unlike the optical MOSFET. Also, when the AD reading is executed at the input port AD of the decision control unit 30, the decision control unit 30 and the detecting circuit 20 are isolated mutually by the AD reading switch SWa, so that a connection line used in the AD reading can be shortened and the circuit that is hard to be influenced by the noise can be realized. Also, when the failure occurs in the detecting circuit 20 as the high-voltage circuit, or the like, the separation of the decision control unit 30 as the low-voltage circuit from the detecting circuit 20 can be made easy. As a result, the insurance of the sure operation of the detecting circuit 20, which is very important as the controlling circuit, and the prevention of the secondary failure induction can be implemented, and the improvement of safety can be achieved.

Second Embodiment

In the present embodiment, as a variation of the first embodiment, such a circuit is proposed that a first resistor R21 as a charging resistor of the measuring system (high voltage circuit) is not shared in respective measuring modes. First, an insulation measuring circuit 210 shown in FIG. 5 will be explained as the premise technology hereunder. A decision control unit 230 has the similar configuration and functions to those of the decision control units 30, 130 in the first embodiment and the background art. The decision control unit 230 controls the opening/closing of first to fifth switches SW21 to SW25 and the AD reading switch SWa provided to a detecting circuit 220, and also makes a decision of the insulation degradation based on voltages (VC1p, VC1n, V0) that are input into the input port AD respectively.

In the detecting circuit 220, the first switch SW21, the first resistor R21, a capacitor C21, a second resistor R22, and the second switch SW22 are arranged in series sequentially from the positive electrode side of the power supply V to the negative electrode side. From such a viewpoint that a Vf loss of the diode should be made equal in respective measuring modes, in some cases a fourth diode D24 (indicated by parentheses in the illustration) may be provided between the first switch SW21 and the first resistor R21.

A first diode D21, a third resistor R23, the third switch SW23, a fourth resistor R24, a fifth resistor R25, and the fourth switch SW24 are arranged in series from the terminal of the capacitor C21 on the positive electrode side connected to the first resistor R21, and then the fourth switch SW24 is connected to the terminal of the capacitor C21 on the negative electrode side (the second resistor R22 side). Also, the fifth switch SW25 serving as the discharging switch and a sixth resistor R26 are grounded in series from an anode of the first diode D21.

A second diode D22 is connected to the terminal of the capacitor C21 on the positive electrode side (anode of the first diode D21) from the middle of a path in which the third resistor R23 and the third switch SW23 are connected. Also, a portion to which the third switch SW23 and the fourth resistor R24 are connected is connected to the input port AD via a protection resistor Rp1 (corresponding to the fifth resistor R5 in FIG. 3) and the AD reading switch SWa. Also, the middle of a path in which the fourth resistor R24 and the fifth resistor R25 is grounded. In this case, a third diode D23 is grounded from a path located between the AD reading switch SWa and the input port AD.

The procedures of deciding the insulation state of the power supply V by using the above configuration are similar to those explained in the background art, and will be explained in brief hereunder.

1) High Voltage V0 Measuring Mode

The decision control unit 230 turns ON the first switch SW21 and the second switch SW22 for a predetermined time only, and thus sets the high voltage V0 on the capacitor C21. Then, the decision control unit 230 turns OFF the first switch SW21 and the second switch SW22, and turns ON the AD reading switch SWa, the third switch SW23, and the fourth switch SW24. Thus, the input port AD measures a value corresponding to the high voltage V0 set on the capacitor C21 (a divided value of the high voltage V0). When the measurement is finished, the decision control unit 230 turns OFF the third switch SW23 and turns ON the fourth switch SW24 and the fifth switch SW25 only, and thus discharges the electric charge on the capacitor C21.

2) Positive-Electrode Side Ground Fault Resistor Voltage VC1p Measuring Mode

Then, the decision control unit 230 turns ON the second switch SW22 and the third switch SW23, and thus sets the positive-electrode side ground fault resistor voltage VC1p on the capacitor C21. Then, the decision control unit 230 turns OFF the second switch SW22 and turns ON the fourth switch SW24, and thus the input port AD measures a value corresponding to the positive-electrode side ground fault resistor voltage VC1p set on the capacitor C21. When the measurement is ended, the decision control unit 230 turns OFF the third switch SW23 and turns ON the fourth switch SW24 and the fifth switch SW25 only, and thus discharges the electric charge on the capacitor C21.

3) Negative-Electrode Side Ground Fault Resistor Voltage VC1n Measuring Mode

In turn, the decision control unit 230 turns ON the first switch SW21 and the fourth switch SW24, and sets the negative-electrode side ground fault resistor voltage VC1n on the capacitor C21. Then, the decision control unit 230 turns OFF the second switch SW22 and turns ON the fourth switch SW24, and thus the input port AD measures a value corresponding to the negative-electrode side ground fault resistor voltage VC1n set on the capacitor C21 (a divided value of the high voltage VC1n). When the measurement is finished, the decision control unit 230 turns OFF the third switch SW23 and turns ON the fourth switch SW24 and the fifth switch SW25 only, and thus discharges the electric charge on the capacitor C21.

4) Insulation Resistor Converting Mode

Then, the decision control unit 230 converts the measured voltage into the insulation resistance based on the above measured result.

Figure 6:
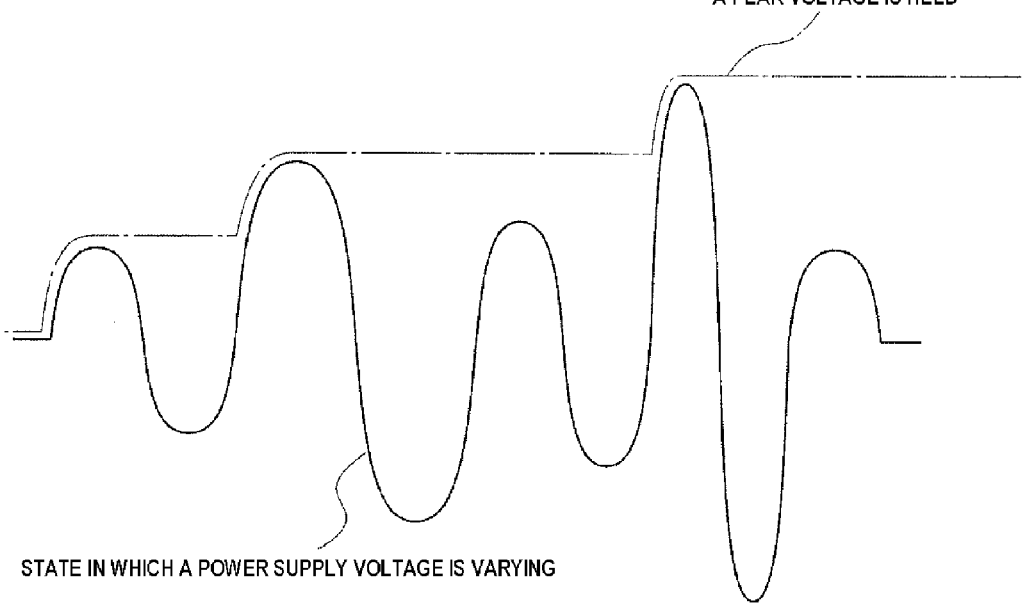
FIG. 6 is a circuit diagram showing the influence of a charging voltage in the configuration of the insulation measuring circuit of flying capacitor type in the premise technology of the second embodiment.

In the above premise technology, as shown in FIG. 6, when the capacitor C21 is charged via the diode, in some cases a peak voltage of the applied voltage is held. For this reason, such a problem exists that, when the applied voltage drops, an amount of variation in the voltage is not reflected in the measured result.

Therefore, like the first embodiment, the AD reading switch SWa and the AD reading capacitor Ca are provided between the input port AD and the detecting circuit 220, and thus not only a structure capable of accumulating the electric charges in the AD reading capacitor Ca in a short time is provided, but also the diodes (D21, D22) are omitted.

Figure 7:
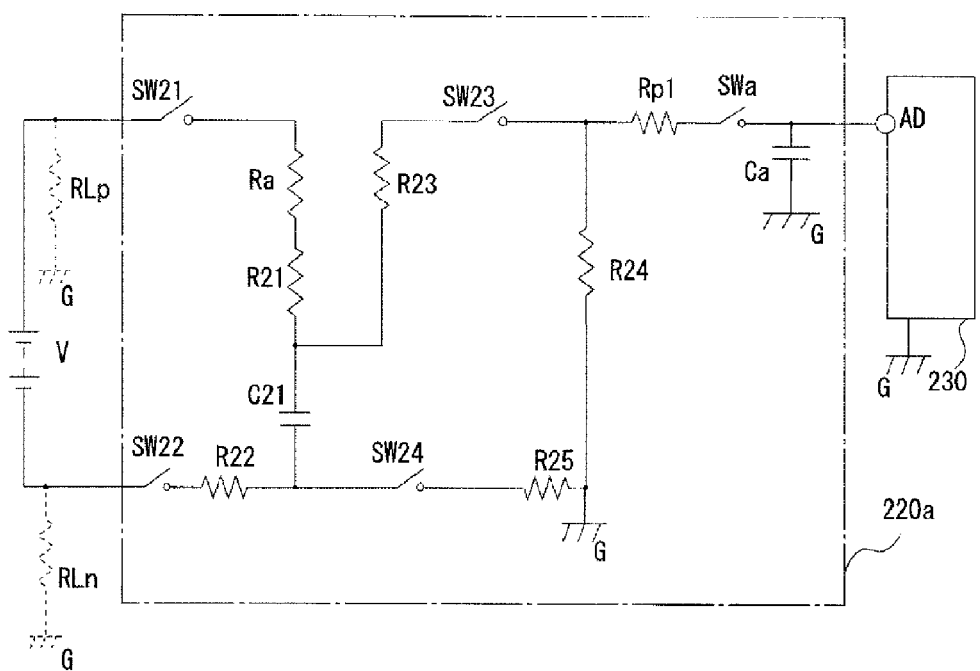
FIG. 7 is a circuit diagram showing a configuration of an insulation measuring circuit of flying capacitor type according to the second embodiment.

FIG. 7 shows a circuit diagram an insulation measuring circuit 210a according to the present embodiment. Here, explanation of the same configurations as those in FIG. 5 will be omitted appropriately by affixing the same reference symbols to them, and different configurations will be explained mainly hereunder.

Figure 5:
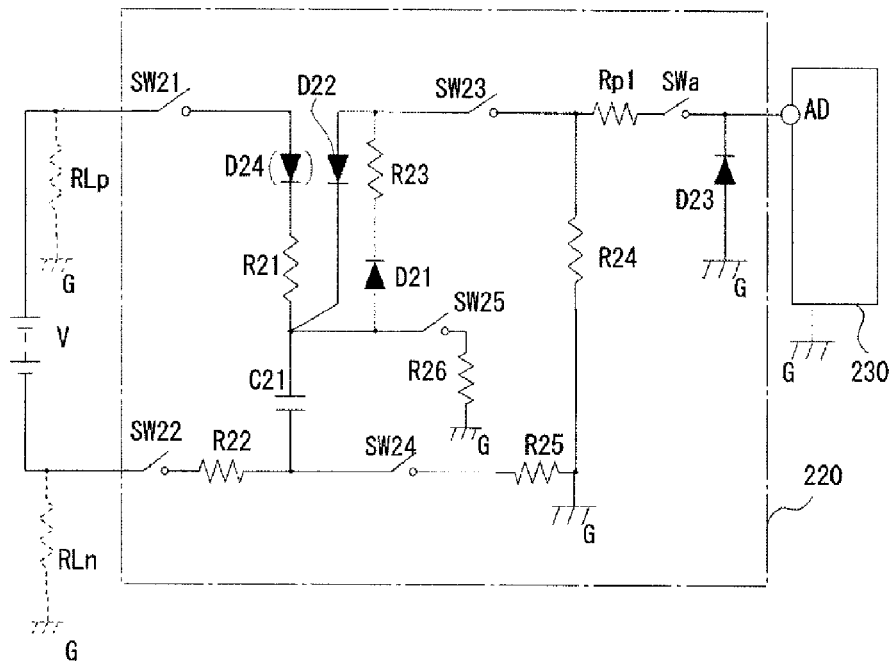
FIG. 5 is a circuit diagram showing a configuration of an insulation measuring circuit of flying capacitor type according to the premise technology of a second embodiment of the present invention.

A different configuration from the insulation measuring circuit 210 in the premise technology in FIG. 5 resides in that, in a detecting circuit 220a of the insulation measuring circuit 210a, the third resistor R23, the fourth resistor R24, and the fifth resistor R25 are set to a sufficiently small resistance value respectively and also the first diode D21 and the second diode D22 are removed. Only the third resistor R23 is arranged between the terminal of the capacitor C21 on the positive electrode side and the third switch SW23. In the case of the premise technology in which the third resistor R23 has a relatively high resistance value, the first diode D21 and the second diode D22 are provided such that both resistance values of the path being constructed in the positive-electrode side ground fault resistor voltage VC1p measuring mode and the path being constructed in the negative-electrode side ground fault resistor voltage VC1n measuring mode are made equal to each other.

However, in the insulation measuring circuit 210a, since the third resistor R23 has a small resistance value, the first diode D21 and the second diode D22 are not needed. Also, the fifth switch SW25 and the sixth resistor R26 constituting the discharging circuit are removed. Further, an adjusting resistor Ra is provided between the first resistor R21 and the first switch SW21. A resistance value of the adjusting resistor Ra is set equal to a resistance value of the third resistor R23.

Also, like the first embodiment, the third resistor R23, the fourth resistor R24, and the fifth resistor R25 are set to a sufficiently small resistance value respectively such that the discharge of the electric charge on the capacitor C21 can be completed quickly without the discharging circuit. When a resistance value of the third resistor R23 is small in contrast to those of the first resistor R21 and the second resistor R22 (when a resistance value of the third resistor R23 is contained in an error range in contrast to the first resistor R21 and the second resistor R22), the addition of the adjusting resistor Ra may be omitted.

The procedures of deciding the insulation state of the power supply V executed by the insulation measuring circuit 210a constructed as above will be explained simply hereunder. These procedures are similar to those in the first embodiment.

1) High Voltage V0 Measuring Mode

The decision control unit 230 turns ON the first switch SW21 and the second switch SW22 only for a predetermined time, and thus sets the high voltage V0 on the capacitor C21. Then, the decision control unit 230 executes the similar operations given in a time chart in FIG. 4.

The decision control unit 230 turns OFF the first and second switches SW21, SW22, and also turns ON the third and fourth switches SW23, SW24 (T1 in FIG. 4). Then, the decision control unit 230 turns ON the AD reading switch SWa for very short time (T1-T2 in FIG. 4) only. In a period in which the AD reading switch SWa is ON (T1-T2 in FIG. 4), the divided voltage of the voltage being set on the capacitor C21 is set on the AD reading capacitor Ca.

Then, when the decision control unit 230 turns OFF the AD reading switch SWa (T2 in FIG. 4), the electric potential of the AD reading capacitor Ca is held. Thus, the decision control unit 230 reads the electric potential that is input into the input port AD within a predetermined period in which the AD reading switch SWa is OFF (T2-T3 in FIG. 4).

At this time, the third switch SW23 and the fourth switch SW24 are still kept in their ON states, and the electric charge on the capacitor C21 is gradually discharged. In the present embodiment, the second resistor R22, the third resistor R23, and the fourth resistor R24 are set to a sufficiently small resistance value respectively, so that the discharge is also completed within a desired time.

Then, when the AD reading is ended (T3 in FIG. 4), the decision control unit 230 turns ON the AD reading switch SWa. At this time, the third switch SW23 and the fourth switch SW24 are still kept in their ON states. Then, the discharge of the electric charge on the capacitor C21 is continued, and also the electric charge accumulated on the AD reading capacitor Ca is discharged to the ground via the AD reading switch SWa, the third resistor R23, etc. When the discharge is finished (T4 in FIG. 4), the decision control unit 230 turns OFF the third switch SW23, the fourth switch SW24, and the AD reading switch SWa.

2) Positive-Electrode Side Ground Fault Resistor Voltage VC1p Measuring Mode

Then, the decision control unit 230 turns ON the second switch SW22 and the third switch SW23, and thus sets the voltage fed from the power supply V via the positive-electrode side ground fault resistor RLp (the positive-electrode side ground fault resistor voltage VC1p) on the capacitor C21. Then, like the high voltage V0 measuring mode, according to the operations similar to those in a time chart in FIG. 4, the decision control unit 230 measures an input values of the input port AD, i.e., a value corresponding to the positive-electrode side ground fault resistor voltage VC1p being set on the capacitor C21 (a divided value of the positive-electrode side ground fault resistor voltage VC1p), and also discharges quickly the electric charges on the capacitor C21 and the AD reading capacitor Ca sequentially.

3) Negative-Electrode Side Ground Fault Resistor Voltage VC1n Measuring Mode

Then, the decision control unit 230 turns ON the first switch SW21 and the fourth switch SW24, and thus sets the voltage fed from the power supply V via the negative-electrode side ground fault resistor RLn (the negative-electrode side ground fault resistor voltage VC1n) on the capacitor C21. Then, like the high voltage V0 measuring mode and the positive-electrode side ground fault resistor voltage VC1p measuring mode, according to the operations similar to those in a time chart in FIG. 4, the decision control unit 230 measures an input value of the input port AD, i.e., a value corresponding to the negative-electrode side ground fault resistor voltage VC1n being set on the capacitor C21 (a divided value of the negative-electrode side ground fault resistor voltage VC1n), and also discharges quickly sequentially the electric charges on the capacitor C21 and the AD reading capacitor Ca.

4) Insulation Resistor Converting Mode

Then, the decision control unit 230 converts the measured voltage into the insulation resistance based on the above measured result.

According to the present embodiment, since such a configuration is employed that the diodes are removed from the detecting circuit 220a, the influence caused due to a Vf loss of the diodes as one of factors of the measuring error can be eliminated. Also, optimization of the circuit, i.e., a cost reduction/a size reduction made by a reduction in the number of components can be achieved. Also, even when the insulation measuring apparatus of the present invention is applied to the high-voltage power supply environment whose variation in the high voltage is large, similarly the influence of variation in the voltage can be reflected adequately and automatically in the measured voltage of the capacitor C21 in all the measuring modes. Further, even when a short-circuit failure is caused in either the third switch SW23 or the fourth switch SW24 in such a configuration that a small resistance value is set to the fourth resistor R24 and the fifth resistor R25 respectively, an excessive current never flows between the high-voltage power supply V and the ground because a sufficiently large resistance value is set to the first resistor R21 and the second resistor R22. Therefore, the secondary failure, etc. are not induced, and also desired safety can be ensured. That is, in such a situation that the first resistor R21 and the second resistor R22 are set to exceed the insulation resistance value that should be guaranteed legally, even when the short-circuit failure occurs in the switch, the insulation resistance is never decreased below the legal value, the system can be stopped safely, and an accident caused by an electric shock, etc. can be prevented.

Third Embodiment

In the present embodiment, as a variation of the second embodiment, such a circuit is proposed that the AD reading switch SWa is omitted and a reduction in the voltage caused due to the discharge of the electric charge during the reading of the AD reading capacitor Ca is corrected by the decision control unit 230.

Figure 8:
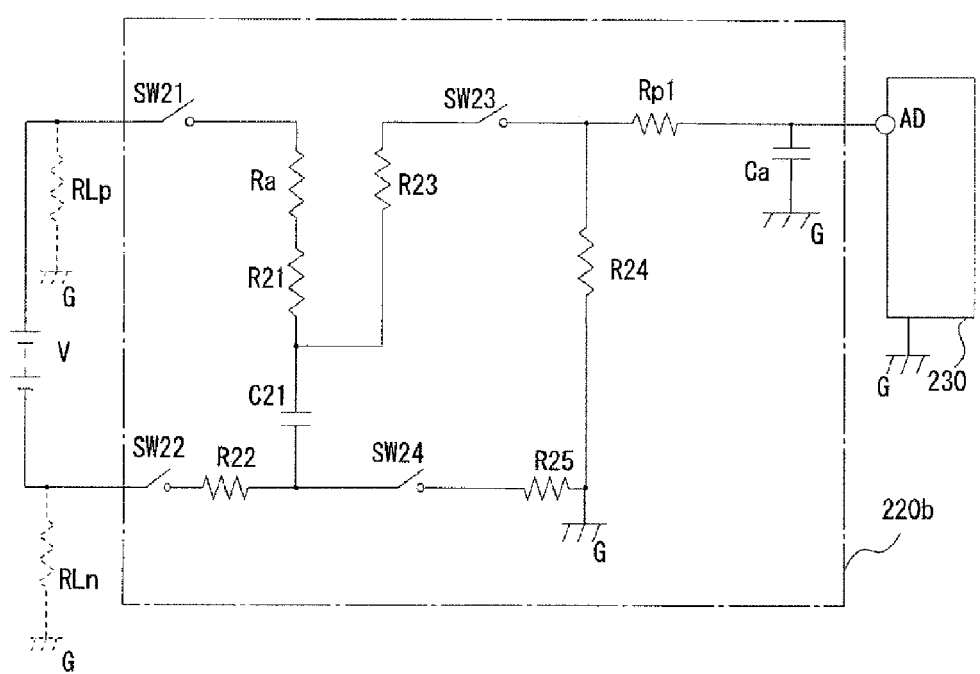
FIG. 8 is a circuit diagram showing a configuration of an insulation measuring circuit of flying capacitor type according to a third embodiment of the present invention.

FIG. 8 shows a circuit diagram of an insulation measuring circuit 210b according to the present embodiment. Here, the same reference symbols are affixed to the same configurations as those in FIG. 7, and their explanation will be omitted appropriately. As the concretely different configuration, in a detecting circuit 220b, the AD reading switch SWa provided between the input port AD of the decision control unit 230 and the fifth resistor R25 as the AD reading protection resistor is omitted. That is, the fifth resistor R25 is connected directly to the input port AD of the decision control unit 230.

In the case of the above configuration, because the AD reading switch SWa is omitted, the electric charge on the AD reading capacitor Ca is not held and is discharged during the AD reading of the decision control unit 230. Therefore, the decision control unit 230 is equipped with a function of compensating a reduction in the measured voltage caused due to the discharge.

Figure 9:
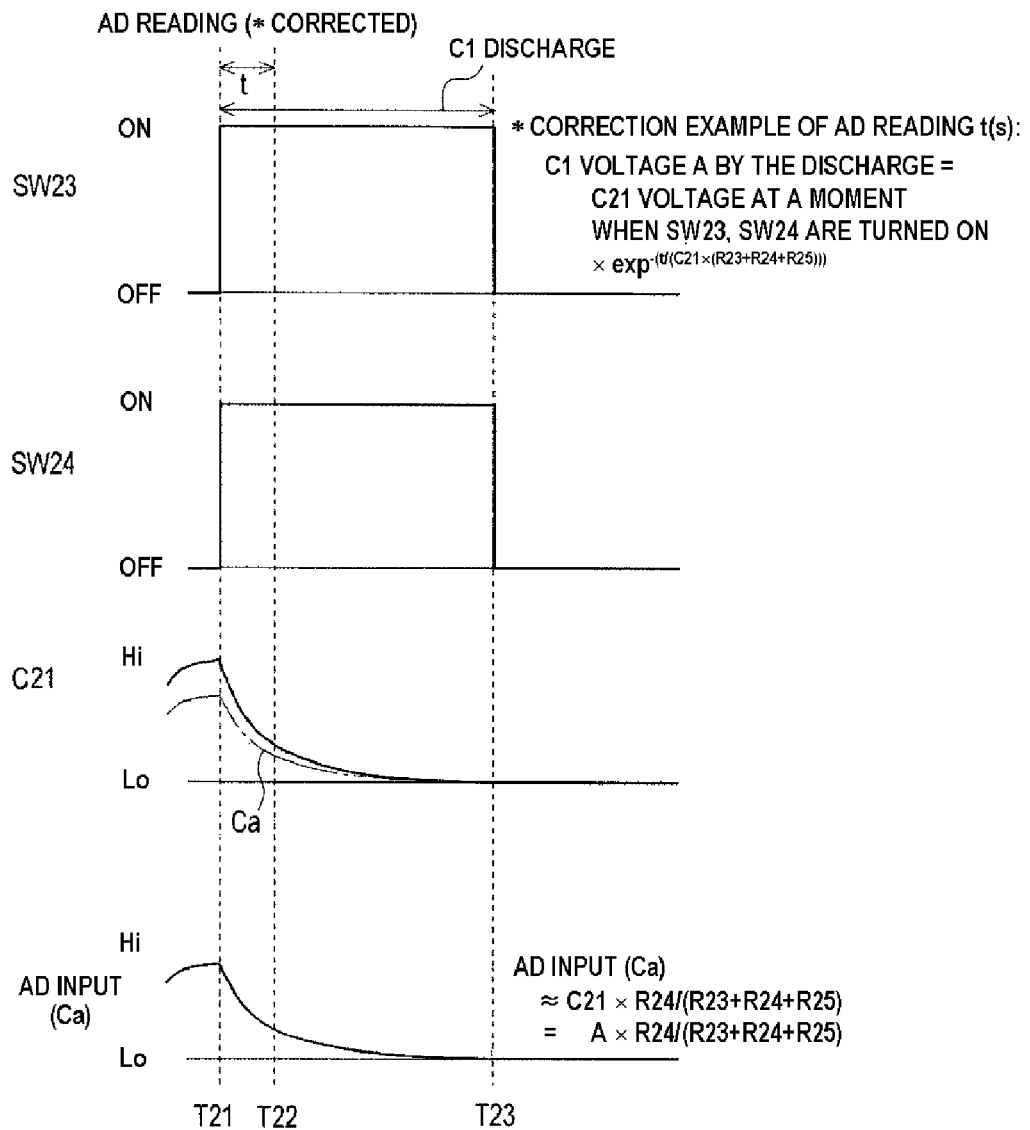
FIG. 9 shows a time chart of an AD reading process in the insulation measuring circuit of flying capacitor type in the third embodiment.

The procedures of deciding the insulation state of the power supply V executed by the insulation measuring circuit 210b having such configuration will be explained in brief hereunder. Here, the procedures of setting the electric charge on the capacitor C21 in respective measuring modes are similar to those in the second embodiment. Thus, mainly the AD reading process in the insulation measuring circuit 230 will be explained hereunder. FIG. 9 is a time chart explaining the AD reading process in the insulation measuring circuit 230 according to the present embodiment.

1) High Voltage V0 Measuring Mode

The insulation measuring circuit 230 turns ON the first switch SW21 and the second switch SW22 for a predetermined time only, and thus sets the high voltage V0 on the capacitor C21. In this case, since the AD reading switch SWa is omitted, a divided voltage of the voltage being set on the capacitor C21 is set on the AD reading capacitor Ca.

Then, the insulation measuring circuit 230 executes the operations shown in a time chart in FIG. 9. First, the insulation measuring circuit 230 turns OFF the first and second switches SW21, SW22, and also turns ON the third and fourth switches SW23, SW24 (T21 in FIG. 9). Then, the insulation measuring circuit 230 reads the electric potential being input into the input port AD in a predetermined period (T21-T22 in FIG. 9).

At this time, the third switch SW23 and the fourth switch SW24 are still kept in their ON states (T21-T23 in FIG. 9), and the electric charge on the capacitor C21 is discharged gradually. Then, the electric charge on the AD reading capacitor Ca is also discharged. Then, when the AD reading is ended (T23 in FIG. 9), the insulation measuring circuit 230 turns OFF the third switch SW23 and the fourth switch SW24.

2) Positive-Electrode Side Ground Fault Resistor Voltage VC1p Measuring Mode and Negative-Electrode Side Ground Fault Resistor Voltage VC1n Measuring Mode In the positive-electrode side ground fault resistor voltage VC1p measuring mode and the negative-electrode side ground fault resistor voltage VC1n measuring mode, according to the similar operations to those in the second embodiment, the positive-electrode side ground fault resistor voltage VC1p and the negative-electrode side ground fault resistor voltage VC1n are set on the capacitor C21 respectively. Then, like the high voltage V0 measuring mode, according to the similar operations in a time chart in FIG. 9, the decision control unit 230 measures respective values corresponding to the positive-electrode side ground fault resistor voltage VC1p and the negative-electrode side ground fault resistor voltage VC1n being set on the capacitor C21 respectively (respective divided voltage values of the positive-electrode side ground fault resistor voltage VC1p and the negative-electrode side ground fault resistor voltage VC1n).

3) Insulation Resistor Converting Mode

When the above measuring mode is ended, the decision control unit 230 executes the insulation resistance conversion based on the above measured result. In this case, the decision control unit 230 does not utilize the measured value (the A/D measured voltage) as it is, but compensates (corrects) a voltage reduction caused by the discharge based on a predetermined table or a computational expression, for example.

Then, a correction example will be explained briefly hereunder. When the third and fourth switches SW23, SW24 are turned ON (T21 in FIG. 9), the AD input (Ca) and the capacitor C21 satisfy following Relation (1) in a situation that a capacitance of the AD reading capacitor Ca is small but the AD input impedance is large.

$$AD\ input(Ca) \cong C21 \times R24/(R23+R24+R25) \quad (1)$$

Then, an amount of discharge caused when a time period between T21 to T22 is set to t(s) is calculated by using following Relation (2), and then a correcting process is applied.

$$A\ voltage\ A\ of\ C21\ by\ the\ discharge = (a\ voltage\ of\ C1\ at\ a\ moment\ SW23, SW24\ are\ turned\ ON) \times \exp^{-(t/(C21 \times (R23+R24+R25)))} \quad (2)$$

Therefore, it is decided based on above Relations (1) and (2) that the AD input (Ca) at this time is not affected by the capacitance of the AD reading capacitor Ca and is expressed by following Relation (3).

$$AD\ input(Ca) \cong A \times R24/(R23+R24+R25) \quad (3)$$

In this manner, compensation of the measured value is done by the decision control unit 230. Therefore, a satisfactory detecting accuracy can be maintained even in the configuration in which the AD reading switch SWa is omitted.

Fourth Embodiment

In the present embodiment, as a variation of the first embodiment shown in FIG. 3 and FIG. 4, the technology to detect the absolute value with predetermined accuracy even when the capacitor C1 as the detecting capacitor varies largely will be explained hereunder. In this case, the reading process applied after the voltage is set on the capacitor C1 is focused in the above embodiments, while the processing of the voltage to be set on the capacitor C1 is focused in the present embodiment. Therefore, it is effective that the present embodiment should be applied to the above embodiments.

In the first embodiment, in the case of the voltage measuring method that does not fully charge the capacitor C1 serving as the detecting capacitor, the detecting accuracy is directly subjected to the influence of varying elements such as the capacitance, the temperature characteristic, etc. of the capacitor C1 as the component that has a great variation of characteristics. Also, when the capacitor C1 is a ceramic capacitor, the DC bias characteristic is added to the varying elements. Therefore, in case the detection of the absolute value of the voltage is needed, a high precision/high stability capacitor must be employed as the capacitor C1 serving as the detecting capacitor, and thus the measures are demanded from a viewpoint of cost.

Also, commonly the film capacitor is suited to the applications in which the small variation of characteristics is requested. However, even excepting the viewpoint of cost, the film capacitor has such features that its shape is of great size and its moisture resistance is low. For this reason, even though the variation of characteristics is increased, i.e., even in the situation that a degradation of the detecting accuracy cannot be avoided, depending on the applied environment, in most cases the use of the ceramic capacitor whose size is small and whose moisture resistance is excellent would be desired. Therefore, in the present embodiment, the technology that makes it possible to attain a desired detecting accuracy even in the case where the ceramic capacitor whose variation of characteristics is great is employed will be explained hereunder. In this case, the configuration of the insulation measuring circuit 10 can be implemented by the configuration shown in FIG. 3. In the following, such a case is supposed that the characteristic variation of the ceramic capacitor used as the capacitor C1 is within ±10%, and the DC bias characteristic is ±20% at a maximum. Also, in the following, explanation will be made under the assumption that the product having the specification value of the capacitor C1 (error zero) is mentioned as a "standard product", the error zero is mentioned as a "referenced value", the product having a plus maximum error (+20%) is mentioned as a "plus maximum product", and the product having a minus maximum error (−20%) is mentioned as a "minus maximum product".

When the decision control unit 30 measures the voltage of the capacitor C1, the measurement is made by not holding the peak voltage unlike the background art but detecting the voltage after the discharge is done in a predetermined time. Then, the decision control unit 30 corrects the high voltage by applying the conversion, which is given by a conceptual expression in following Equation (4), to an amount of discharge being set by a time constant of discharge based on this detected voltage.

$$High\ voltage = detected\ voltage/(amount\text{-}of\text{-}discharge\ conversion \times amount\text{-}of\text{-}charge\ conversion) \quad (4)$$

Figure 10:
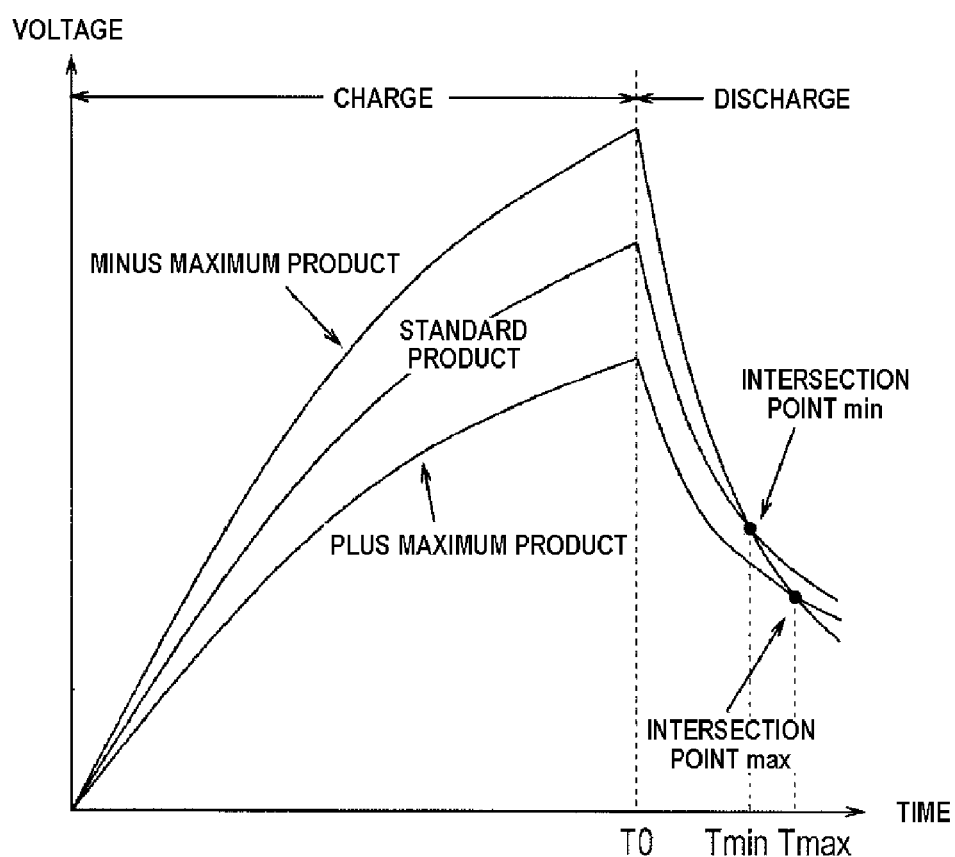
FIG. 10 is a graph of a voltage transition to explain the measuring approach according to a fourth embodiment of the present invention.

An outline of the measuring approach will be explained with reference to a schematic graph in FIG. 10 as follows.

An intersection point min as a coincidence point between a change of the discharge voltage in time based on the reference value of capacitance of the capacitor (capacitance of the capacitor C1) and a change of the discharge voltage in time based on the minus maximum product (MIN value) is set. Here, the wording "change of the discharge voltage in time" denotes a change of the voltage in time when the discharge is started after the charging is done in a predetermined time. Similarly, an intersection point max between a change of the discharge voltage in time based on the reference value of the capacitor and a change of the discharge voltage in time based on the plus maximum product (MAX value) is set. Then, a detection timing is set between the intersection point min and the intersection point max. Otherwise, a detection timing is set near the intersection point min or the intersection point max.

In other words, first the intersection point with the standard product is estimated based on a peak voltage that is measured at a charging start point T0, and then a measuring timing located between an intersection point min (Tmin) and an intersection point max (Tmax) is selected based on this intersection point. Here, a plurality of intersection points A, B, C located between the intersection point min and the intersection point max are discriminated and set in advance. That is, first a peak voltage value is measured (step S1), and then the predetermined measuring timing B out of the intersection points A to C is selected (step S2). Then, the voltage value is measured at the selected measuring timing B (step S3).

A further explanation will be given in more detail hereunder. A variation in an amount of charging caused by the variation is large, nevertheless a variation in detected voltage after the electric charge is discharged for a predetermined time becomes small. Concretely, the charging voltage V1 and the charging voltage V2 are represented by following Equation (5) and Equation (6).

$$The\ charging\ voltage\ V1 = V0 \times (1 - \exp^{-(t1/(C1 \times a \times R1))}) \quad (5)$$

$$The\ charging\ voltage\ V2 = V0 \times (\exp^{-(t2/(C1 \times a \times R2'))}) \quad (6)$$

Where V0: applied voltage, t1: charging time, t2: discharging time, C1: capacitance of the capacitor C1, R1: resistance value of the charging resistor (first resistor), R2': resistance value (R2'=R2+R3+R4) of, and a: variation of the capacitor C1.

As can be seen from above Equation (5) and Equation (6), the charging voltage within a predetermined time is increased when an error is caused in the direction along which a capacitance of the capacitor C1 is decreased. At the same time, an amount of discharge within a predetermined time is increased after the charging. Also, the charging voltage within a predetermined time is decreased when an error is caused in the direction along which a capacitance of the capacitor C1 is increased. At the same time, an amount of discharge within a predetermined time is decreased after the charging. As a result, an amount of variation caused due to the error is canceled. That is, the charging and discharging actions are executed by using the same capacitor C1 as the detecting capacitor, so that the discharging voltage at a time of discharge is increased even when the charging voltage is increased due to the variation of the capacitor C1. Therefore, when measurement is executed after the discharge is conducted for a predetermined time after the charging, an amount of variation in the detected voltage due to the variation is canceled.

Therefore, when the applied voltage V0 is calculated from the detected voltage, the detection accuracy attained in calculating the applied voltage V0 by following Equation (7) is improved rather than that attained in calculating the applied voltage V0' by Equation (8) in the background art.

$$V0=V2/((\text{discharge rate given by } t2 \text{ and } C1 \times R2') \times (\text{discharge rate given by } t1 \text{ and } C1 \times R1)) \quad (7)$$

$$V0'=V1/(\text{charge rate given by } t1 \text{ and } C1 \times R1) \quad (8)$$

Here, the "discharge rate" denotes a charge remaining rate after the discharge.

The above measuring approach will be explained concretely with reference to measured results in FIGS. 11A, 11B and FIGS. 12A, 12B and above FIG. 10 hereunder. Since a maximum value of variation of the capacitor C1 is made clear by the component information, such maximum value can be set as follows.

Figure 11A:
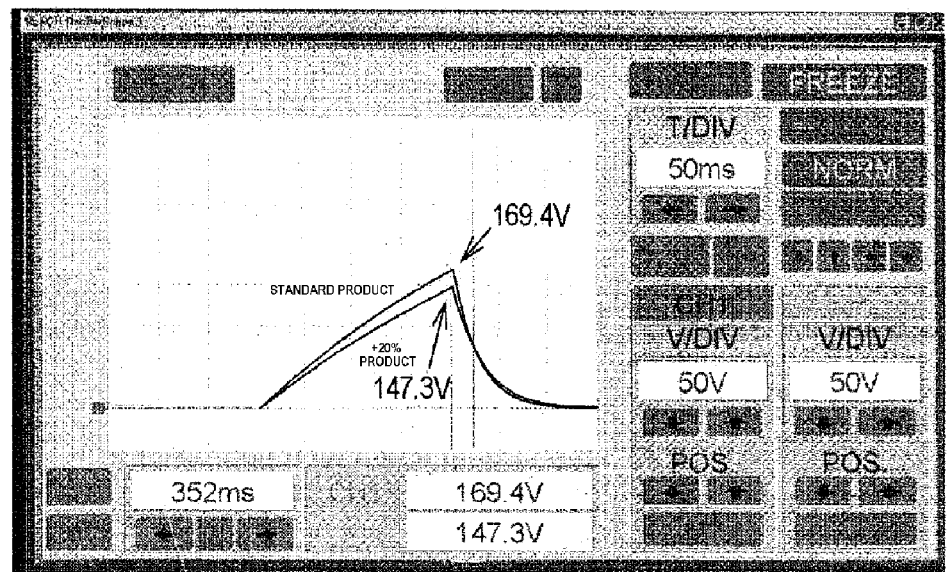
FIGS. 11A and 11B are graphs showing measured results of respective voltage transitions of a plus maximum product and a standard product in the fourth embodiment.
Figure 11B:
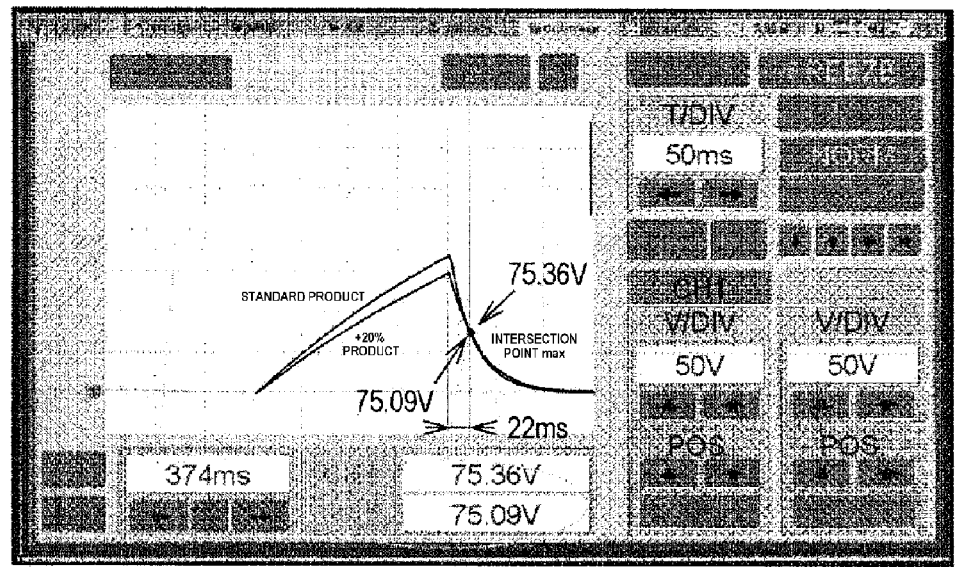

(1) Such a case will be explained hereunder that, when the discharge is carried out after the charging is completed for a predetermined time (before the full charge) by using the plus maximum product (MAX value) and the standard product (variation 0) respectively, a time at which these voltages coincide with each other (a time at which the discharge curves intersect with each other: intersection point max) is set as the measuring point. According to this setting, the accuracy in detecting the plus maximum variation can be improved with pinpoint accuracy. For example, by reference to the measured results in FIGS. 11A, 11B, as shown in FIG. 11A, the measured value is 169.4 V under the condition using the standard product when the charging is ended (when the discharge is started). In contrast, the measured value is 147.3 V, which is decreased by 13.0%, under the condition using the plus maximum product. However, as shown in FIG. 11B, the measured values obtained under respective conditions using the standard product and the plus maximum product are 75.36 V and 75.09 V respectively, which are substantially equal respectively, when 22 ms has elapsed from the start of discharge.

Figure 12A:
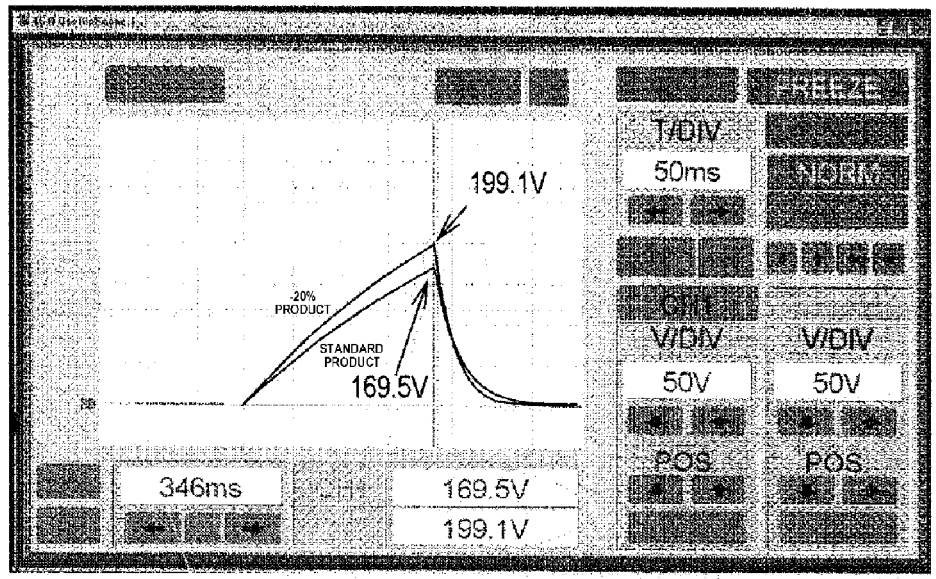
FIGS. 12A and 12B are graphs showing measured results of respective voltage transitions of a minus maximum product and a standard product in the fourth embodiment.
Figure 12B:
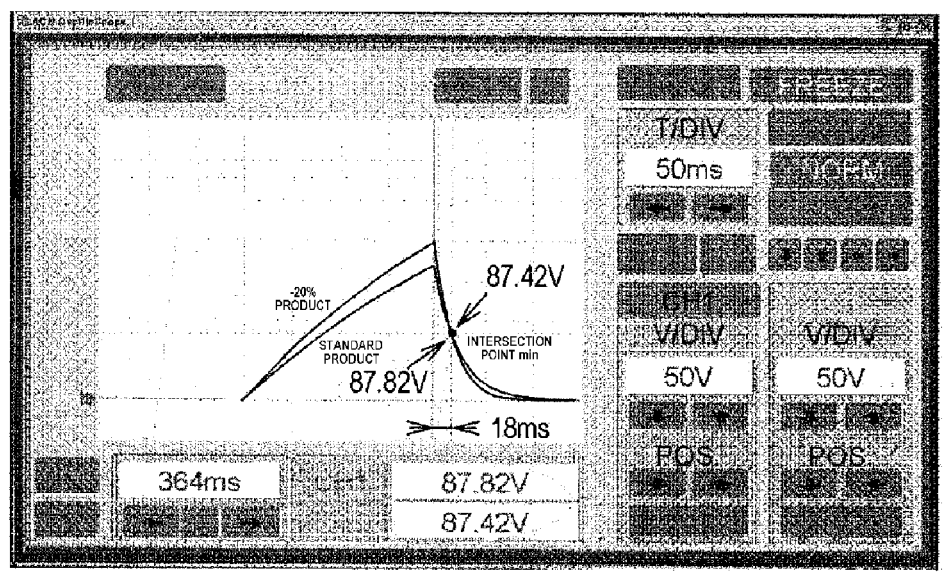

(2) Such a case will be explained hereunder that, when the discharge is carried out after the charging is completed for a predetermined time (before the full charge) by using the minus maximum product (MIN value) and the standard product (variation 0) respectively, a time at which these voltages coincide with each other (a time at which the discharge curves intersect with each other: intersection point min) is set as the measuring point. According to this setting, the accuracy in detecting the minus maximum variation can be improved with pinpoint accuracy. By reference to the measured results in FIGS. 12A, 12B, as shown in FIG. 12A, the measured value is 169.5 V under the condition using the standard product when the charging is ended (when the discharge is started). In contrast, the measured value is 199.1 V, which is increased by 17.5%, under the condition using the minus maximum product. However, as shown in FIG. 12B, the measured values obtained under respective conditions using the standard product and the minus maximum product are 87.82 V and 87.42 V respectively, which are substantially equal respectively, when 18 ms has elapsed from the start of discharge.

(3) In the situation that the measuring point is set between the above cases (1) and (2), i.e., the intersection point max and the intersection point min, even if the measured value is deviated to either side of ±maximum sides from the reference value, the accuracy is not so highly improved as the cases (1) and (2), nevertheless the detecting accuracy can be improved over a wider variation range.

With the above, the present invention is explained based on the embodiments. The embodiments are given by way of example. It is possible for those skilled in the art to understand that various variations can be applied to respective constituent elements of them and their combinations and these variations can also be included in a scope of the present invention. The technology to illustrate the ceramics capacitor, as mentioned above, can also be applied to the film capacitor depending on the employed situations. In the event that the inexpensive product is employed as the film capacitor, a variation of the capacitance is increased in some cases, but the foregoing technology can also applied in such cases.

What is claimed is:

1. An insulation measuring apparatus, comprising:
a measuring circuit including a first capacitor as a flying capacitor;
a control unit that is adapted to read a voltage set on the first capacitor to decide an insulation state of a power supply, and control a path configuration of the measuring circuit configured when one selected from a power supply voltage, a positive-electrode side ground fault resistor voltage, and a negative-electrode side ground fault resistor voltage is to be set on the first capacitor;
a switching section provided in a path located between the measuring circuit and the control unit, for shutting off the path between the measuring circuit and the control unit; and
a second capacitor provided between a ground and a path located between the switching section and the control unit, wherein
the control unit is adapted to control the path configuration of the measuring circuit when the control unit is to read the voltage set on the first capacitor, by turning ON the switching section to set a voltage corresponding to the voltage that is set on the first capacitor on the second capacitor, and then by turning OFF the switching section to read the voltage set on the second capacitor and to discharge an electric charge corresponding to the voltage being set on the first capacitor, and
in the measuring circuit, a resistance value of a path that is controlled to discharge the electric charge of the first capacitor is being set to a value which the electric charge corresponding to the voltage set on the first capacitor is dischargeable in a reading period of the voltage by the control unit.

2. The insulation measuring apparatus according to claim 1, wherein the control unit turns ON the switching section to discharge the electric charge corresponding to the voltage set on the second capacitor after reading the voltage set on the second capacitor.

3. The insulation measuring apparatus according to claim 1, wherein, upon setting the voltage on the first capacitor, the control unit charges the first capacitor for a first predetermined time in which the first capacitor is not fully charged, and then discharges the first capacitor for a second predetermined time, and the control unit calculates the voltage which is to be set when the first capacitor is fully charged by reflecting a charging rate in the first predetermined time and a charging rate in the second predetermined time in a read value of the voltage being set on the first capacitor.

4. The insulation measuring apparatus according to claim 3, wherein the second predetermined time is set as a time elapsed from a start of discharge to a first coincidence point at which a voltage transition occurred from a start of charge on an assumption that a standard product whose specification error is zero is employed as the first capacitor coincides with a voltage transition occurred from a start of charge on an assumption that a plus variation product whose specification error is at a plus maximum is employed as the first capacitor.

5. The insulation measuring apparatus according to claim 3, wherein the second predetermined time is set as a time elapsed from a start of discharge to a second coincidence point at which a voltage transition occurred from a start of charge on an assumption that a standard product whose specification error is zero is employed as the first capacitor coincides with a voltage transition occurred from a start of charge on an assumption that a plus variation product whose specification error is at a minus maximum is employed as the first capacitor.

6. The insulation measuring apparatus according to claim 3, wherein, where a point at which a voltage transition occurred from a start of charge on an assumption that a standard product whose specification error is zero is employed as the first capacitor coincides with a voltage transition occurred from a start of charge on an assumption that a plus variation product whose specification error is at a plus maximum is employed as the first capacitor is set as a first coincidence point, and where a point at which a voltage transition occurred from a start of charge on an assumption that a standard product whose specification error is zero is employed as the first capacitor coincides with a voltage transition occurred from a start of charge on an assumption that a minus variation product whose specification error is at a minus maximum is employed as the first capacitor is set as a second coincidence point, the second predetermined time is set from the start of discharge to a point located between the first coincidence point and the second coincidence point.

7. The insulation measuring apparatus according claim 3, wherein the first capacitor is formed of a ceramics capacitor or a film capacitor.

8. An insulation measuring apparatus, comprising:

a measuring circuit including a first capacitor as a flying capacitor;

a control unit that is adapted to read a voltage set on the first capacitor to decide an insulation state of a power supply, and control a path configuration of the measuring circuit configured when one selected from a power supply voltage, a positive-electrode side ground fault resistor voltage, and a negative-electrode side ground fault resistor voltage is to be set on the first capacitor; and a second capacitor which is provided between a ground and a path located between the measuring circuit and the control unit, and on which a voltage is set when the voltage is set on the first capacitor, wherein the control unit is adapted to configure a path through which electric charges accumulated on the first capacitor and the second capacitor are discharged when starting an operation of reading the voltage set on the second capacitor, and to compensate a reduction of voltage, which is caused by the discharge in a measuring period of the voltage set on the second capacitor, when measuring the insulation state, and in the measuring circuit, a resistance value of a path that is controlled to discharge the electric charge of the first capacitor is being set to a value which the electric charge corresponding to the voltage set on the first capacitor is quickly discharged in a reading period of the voltage by the control unit.

9. The insulation measuring apparatus according to claim 8, wherein, upon setting the voltage on the first capacitor, the control unit charges the first capacitor for a first predetermined time in which the first capacitor is not fully charged, and then discharges the first capacitor for a second predetermined time, and the control unit calculates the voltage which is to be set when the first capacitor is fully charged by reflecting a charging rate in the first predetermined time and a charging rate in the second predetermined time in a read value of the voltage being set on the first capacitor.

10. The insulation measuring apparatus according to claim 9, wherein the second predetermined time is set as a time elapsed from a start of discharge to a first coincidence point at which a voltage transition occurred from a start of charge on an assumption that a standard product whose specification error is zero is employed as the first capacitor coincides with a voltage transition occurred from a start of charge on an assumption that a plus variation product whose specification error is at a plus maximum is employed as the first capacitor.

11. The insulation measuring apparatus according to claim 9, wherein the second predetermined time is set as a time elapsed from a start of discharge to a second coincidence point at which a voltage transition occurred from a start of charge on an assumption that a standard product whose specification error is zero is employed as the first capacitor coincides with a voltage transition occurred from a start of charge on an assumption that a plus variation product whose specification error is at a minus maximum is employed as the first capacitor.

12. The insulation measuring apparatus according to claim 9, wherein, where a point at which a voltage transition occurred from a start of charge on an assumption that a standard product whose specification error is zero is employed as the first capacitor coincides with a voltage transition occurred from a start of charge on an assumption that a plus variation product whose specification error is at a plus maximum is employed as the first capacitor is set as a first coincidence point, and where a point at which a voltage transition occurred from a start of charge on an assumption that a standard product whose specification error is zero is employed as the first capacitor coincides with a voltage transition occurred from a start of charge on an assumption that a minus variation product whose specification error is at a minus maximum is employed as the first capacitor is set as a second coincidence point, the second predetermined time is set from the start of discharge to a point located between the first coincidence point and the second coincidence point.

13. The insulation measuring apparatus according claim 9, wherein the first capacitor is formed of a ceramics capacitor or a film capacitor.

* * * * *